United States Patent
Jo et al.

(10) Patent No.: US 12,255,099 B2
(45) Date of Patent: Mar. 18, 2025

(54) METHODS OF FORMING FIN-ON-NANOSHEET TRANSISTOR STACKS

(71) Applicant: Samsung Electronics Co., Ltd., Suwon-si (KR)

(72) Inventors: Gunho Jo, Schenectady, NY (US); Ki-il Kim, Clifton Park, NY (US); Byounghak Hong, Albany, NY (US)

(73) Assignee: Samsung Electronics Co., Ltd. (KR)

( * ) Notice: Subject to any disclaimer, the term of this patent is extended or adjusted under 35 U.S.C. 154(b) by 537 days.

(21) Appl. No.: 17/590,863

(22) Filed: Feb. 2, 2022

(65) Prior Publication Data

US 2023/0133731 A1 May 4, 2023

Related U.S. Application Data

(60) Provisional application No. 63/272,814, filed on Oct. 28, 2021.

(51) Int. Cl.
*H01L 21/822* (2006.01)
*H01L 21/02* (2006.01)
(Continued)

(52) U.S. Cl.
CPC .... *H01L 21/8221* (2013.01); *H01L 21/02532* (2013.01); *H01L 21/0259* (2013.01); *H01L 21/30604* (2013.01); *H01L 21/308* (2013.01); *H01L 21/823412* (2013.01); *H01L 21/823431* (2013.01); *H01L 27/0688* (2013.01); *H01L 27/0886* (2013.01); *H01L 29/0665* (2013.01); *H01L 29/42392* (2013.01);
(Continued)

(58) Field of Classification Search
CPC ........... H01L 21/02532; H01L 21/0259; H01L 21/30604; H01L 21/308; H01L 21/3086; H01L 21/8221; H01L 21/8234; H01L 21/823412; H01L 21/823431; H01L 27/0688; H01L 27/0886; H01L 29/0665; H01L 29/0673; H01L 29/42392; H01L 29/66439; H01L 29/66477; H01L 29/66742; H01L 29/66795; H01L 29/775; H01L 29/785; H01L 29/78696; B82Y 10/00; B82Y 40/00
See application file for complete search history.

(56) References Cited

U.S. PATENT DOCUMENTS 9,449,880 B1  9/2016  Tseng et al.
9,589,848 B2  3/2017  Cheng et al.
(Continued)

FOREIGN PATENT DOCUMENTS

CN        113206090 A    8/2021

OTHER PUBLICATIONS

Extended European Search Report corresponding to EP 22200846.8, dated Mar. 2, 2023 (11 pages).

*Primary Examiner* — Cheung Lee
(74) *Attorney, Agent, or Firm* — Myers Bigel, P.A.

(57) ABSTRACT

Methods of forming a plurality of transistor stacks are provided. A method of forming a plurality of transistor stacks includes etching a plurality of nanosheets, using a plurality of spacers that are on sidewalls of a plurality of semiconductor fins as an etch mask, to provide a plurality of spaced-apart nanosheet stacks that each have at least one of the semiconductor fins thereon.

19 Claims, 18 Drawing Sheets

(51) Int. Cl.
  *H01L 21/306*  (2006.01)
  *H01L 21/308*  (2006.01)
  *H01L 21/8234* (2006.01)
  *H01L 27/06*   (2006.01)
  *H01L 27/088*  (2006.01)
  *H01L 29/06*   (2006.01)
  *H01L 29/423*  (2006.01)
  *H01L 29/66*   (2006.01)
  *H01L 29/78*   (2006.01)
  *H01L 29/786*  (2006.01)

(52) U.S. Cl.
  CPC .. *H01L 29/66742* (2013.01); *H01L 29/66795* (2013.01); *H01L 29/785* (2013.01); *H01L 29/78696* (2013.01)

(56) References Cited

U.S. PATENT DOCUMENTS

| | | |
|---|---|---|
| 9,755,049 B2 | 9/2017 | Paak et al. |
| 10,121,785 B2 | 11/2018 | Kanakasabapathy et al. |
| 10,381,476 B2 | 8/2019 | Bi et al. |
| 10,991,626 B2 | 4/2021 | Smith et al. |
| 10,991,627 B2 | 4/2021 | Chen et al. |
| 2010/0085812 A1* | 4/2010 | Kang ............... H10B 41/30 365/185.05 |
| 2016/0211168 A1 | 7/2016 | Paak et al. |
| 2016/0254191 A1 | 9/2016 | Tseng et al. |
| 2019/0326286 A1 | 10/2019 | Xie et al. |
| 2019/0393214 A1 | 12/2019 | Lilak et al. |
| 2021/0020446 A1 | 1/2021 | Sieg et al. |
| 2021/0175128 A1 | 6/2021 | Gardner et al. |
| 2021/0210349 A1 | 7/2021 | Xie et al. |
| 2021/0313326 A1 | 10/2021 | Lim et al. |
| 2022/0013521 A1 | 1/2022 | Zhang et al. |

\* cited by examiner

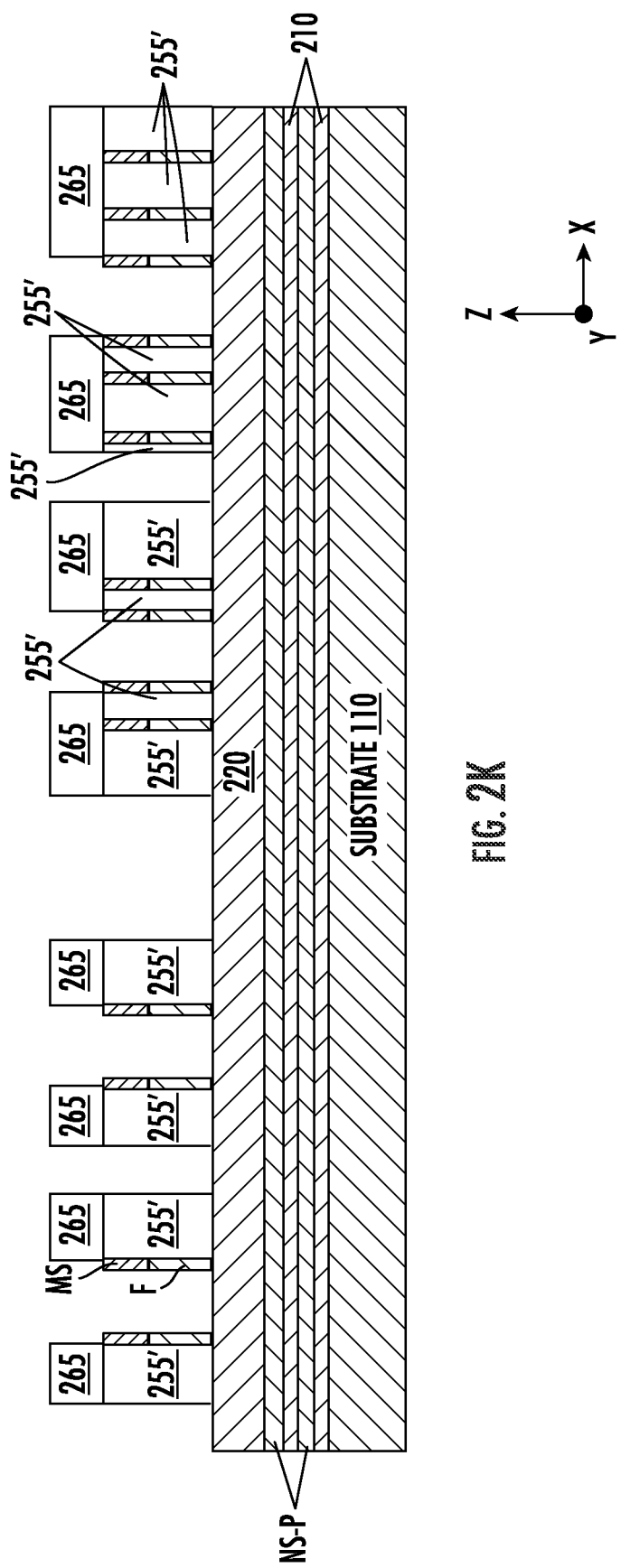

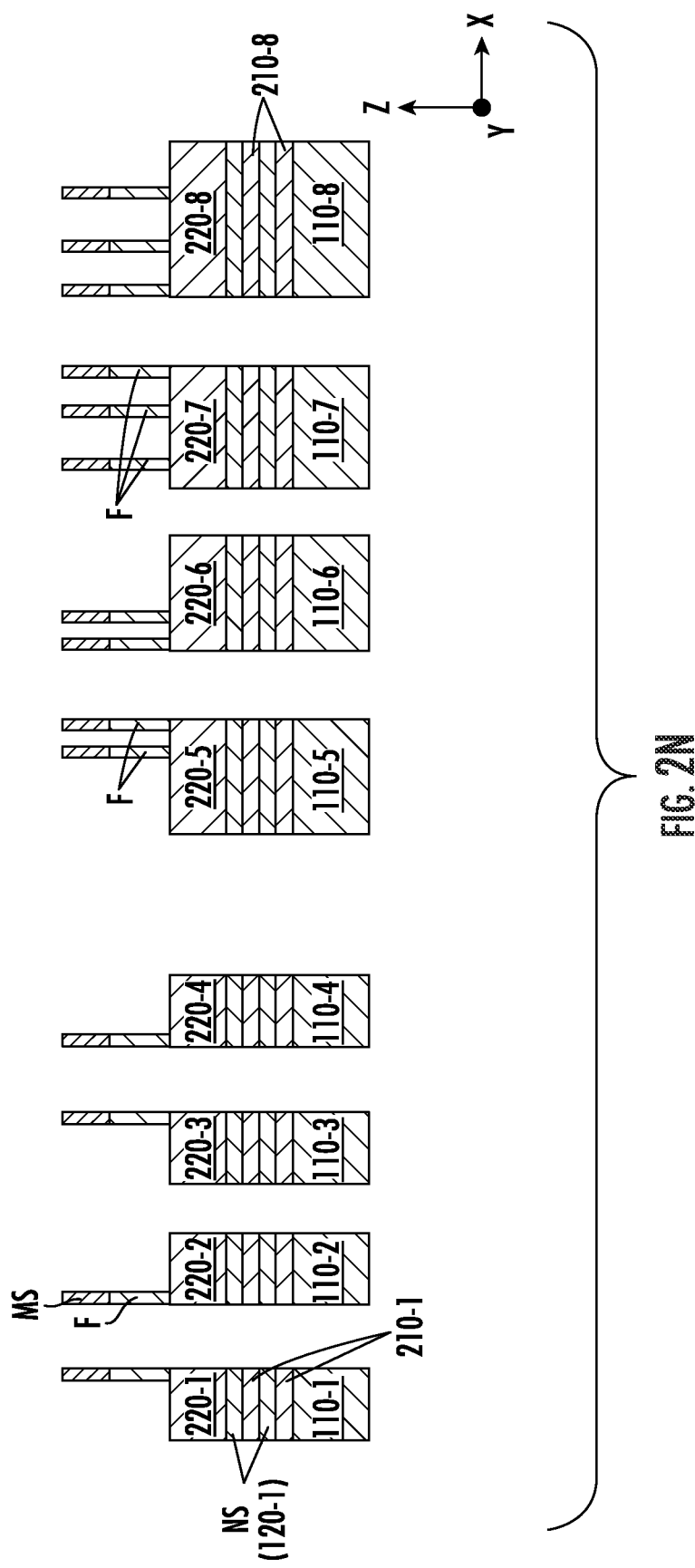

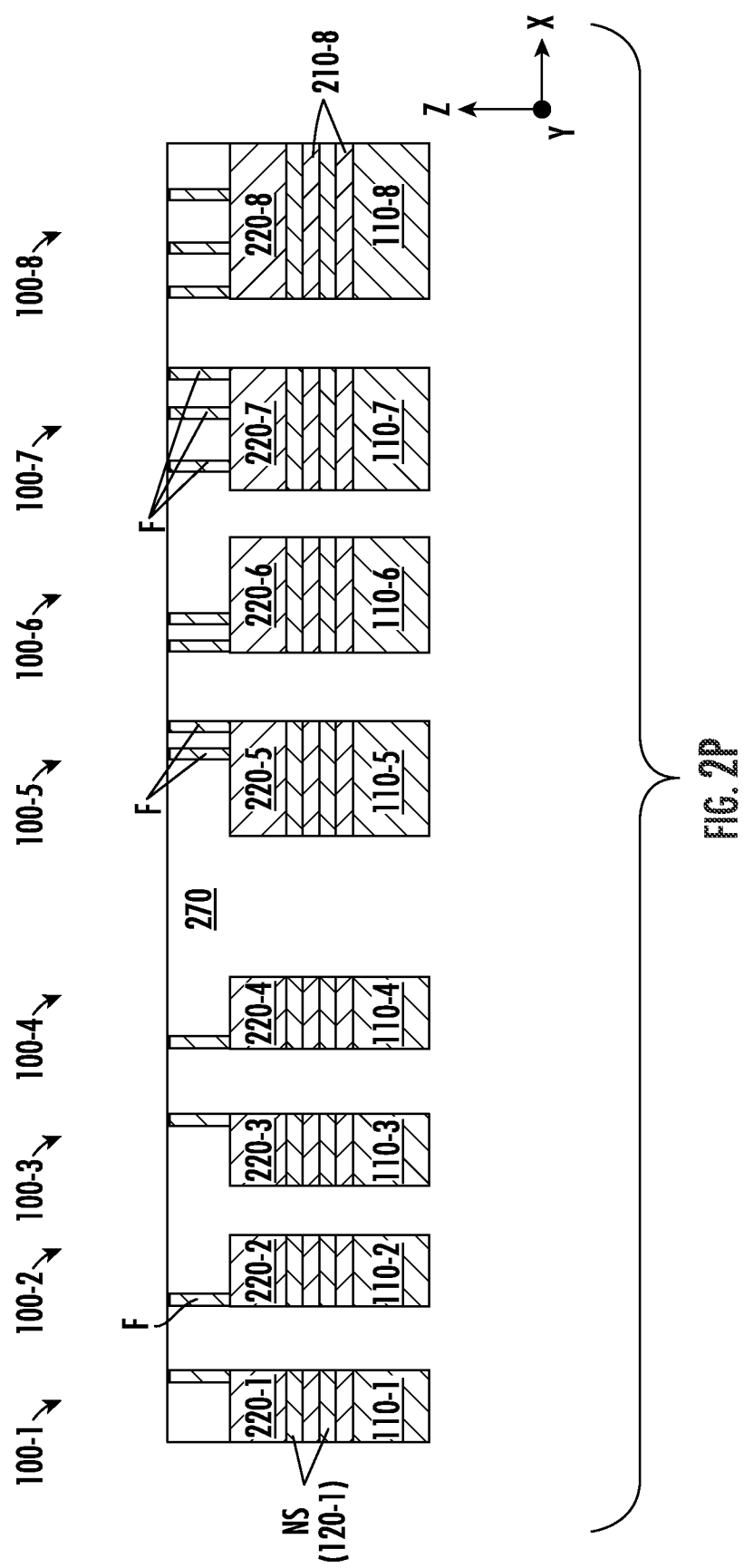

METHODS OF FORMING FIN-ON-NANOSHEET TRANSISTOR STACKS

CLAIM OF PRIORITY

The present application claims the benefit of U.S. Provisional Patent Application Ser. No. 63/272,814, filed on Oct. 28, 2021, entitled INTEGRATED CIRCUIT DEVICES INCLUDING FINS ON NANOSHEETS AND METHOD OF FORMING THE SAME, the disclosure of which is hereby incorporated herein in its entirety by reference.

FIELD

The present disclosure generally relates to the field of semiconductor devices and, more particularly, to three-dimensional transistor structures.

BACKGROUND

The density of transistors in electronic devices has continued to increase. Though three-dimensional transistor structures can help to increase transistor density, it may be difficult to form some features of three-dimensional transistor structures. For example, though transistors may be stacked on top of each other, it may be difficult to form some features of stacked transistors.

SUMMARY

A method of forming a plurality of transistor stacks, according to some embodiments herein, may include providing a stack including a plurality of nanosheets and a semiconductor layer that is on the nanosheets. The method may include forming a mask on the stack. The semiconductor layer may be between the mask and the nanosheets. The method may include forming an asymmetric layer on the mask. The asymmetric layer may include a plurality of segments, at least some of which have different respective widths. The method may include forming first spacers on sidewalls of the segments of the asymmetric layer. The method may include etching the mask, while the first spacers are thereon, to form a plurality of mask segments between the first spacers, respectively, and the semiconductor layer. The method may include etching the semiconductor layer to form a plurality of fins between the mask segments, respectively, and the nanosheets. The method may include forming second spacers on sidewalls of the fins. Moreover, the method may include etching the nanosheets, while the second spacers are on the sidewalls of the fins, to provide a plurality of spaced-apart nanosheet stacks that each have at least one of the fins thereon.

A method of forming a plurality of transistor stacks, according to some embodiments herein, may include etching a plurality of nanosheets, using a plurality of spacers that are on sidewalls of a plurality of semiconductor fins as an etch mask, to provide a plurality of spaced-apart nanosheet stacks that each have at least one of the semiconductor fins thereon.

A method of forming a plurality of transistor stacks, according to some embodiments herein, may include forming an asymmetric layer including a plurality of segments, at least some of which have different respective widths, on a mask that is on a plurality of nanosheets. The method may include forming a plurality of spacers on sidewalls of the segments of the asymmetric layer. The method may include etching the mask, while the spacers are thereon, to form a plurality of mask segments. Moreover, the method may include etching a semiconductor layer that is between the mask segments and the nanosheets to form a plurality of fins between the mask segments, respectively, and the nanosheets.

DETAILED DESCRIPTION

Pursuant to embodiments of the present invention, methods of forming transistor stacks are provided. A spacer-image-transfer ("SIT") process is an example of a process that can be used to form a single fin or dual fins in a transistor stack that comprises the fin(s) on a nanosheet stack. In a SIT process, a single fin may be formed under a spacer that serves as an etch mask, or two fins may be formed under two spacers, respectively. The fin(s) can thus have the same width as the overlying spacer(s), which can subsequently be removed. Though a SIT process has been used to form the fin(s) in a self-aligned manner after the underlying nanosheets have been etched, it may be difficult to increase the number (or to vary the locations) of fins that are in a fin-on-nanosheet structure. Embodiments of the present invention, however, provide methods that can form multiple and/or asymmetrical fins in a fin-on-nanosheet structure before etching the nanosheets that underly the fins into separate nanosheet stacks. Moreover, embodiments of the present invention may be relatively easy to implement due to process overlaps with conventional fin field-effect transistor ("FinFET") processes.

Example embodiments of the present invention will be described in greater detail with reference to the attached figures.

Figure 1:
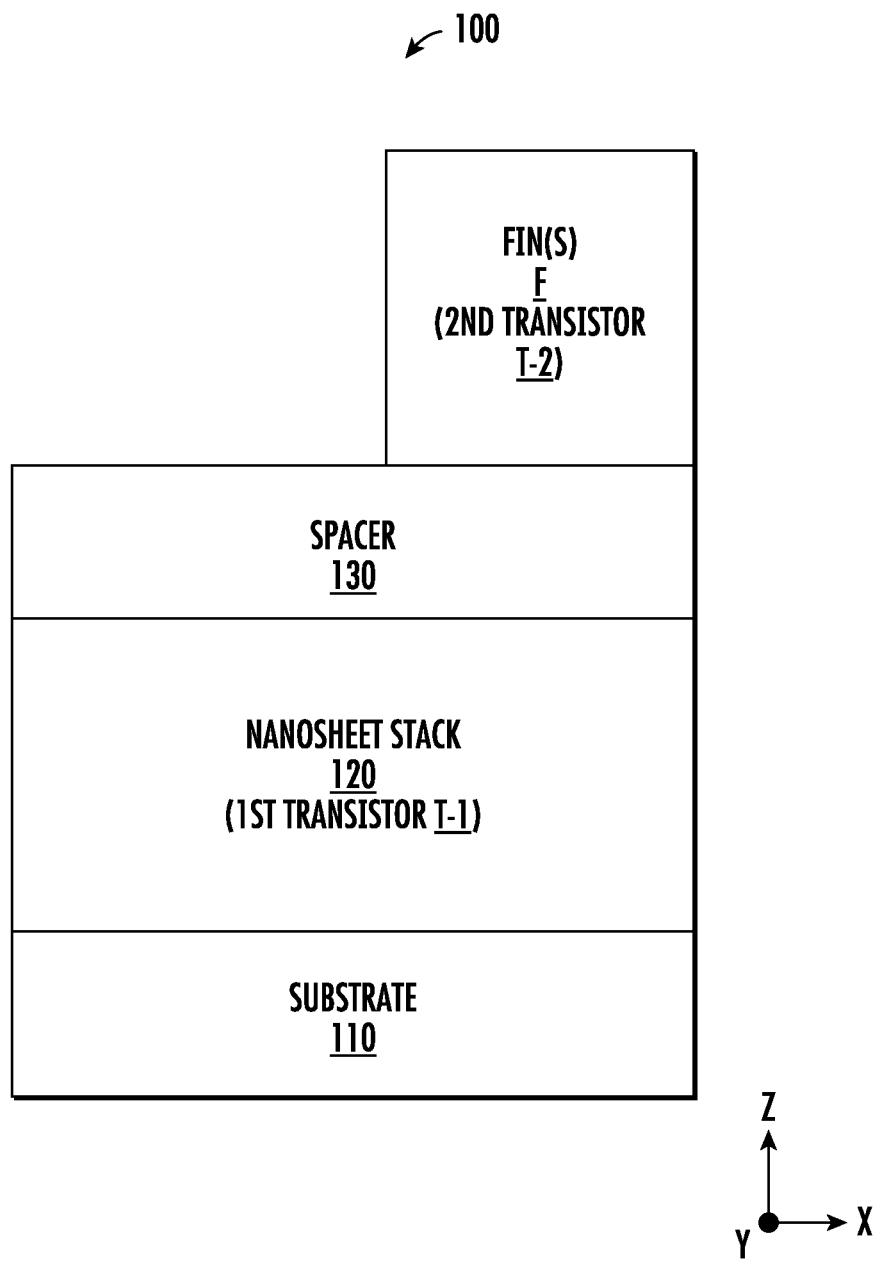
FIG. 1 is a schematic block diagram of a transistor stack according to some embodiments of the present invention.

FIG. 1 is a schematic block diagram of a transistor stack 100 according to some embodiments of the present invention. The stack 100 includes a first transistor T-1 having a nanosheet stack 120 and a second transistor T-2 having one or more fins F. The first transistor T-1 is thus a nanosheet transistor, and the second transistor T-2 is a FinFET. The first transistor T-1 is between, in a vertical direction Z, the second transistor T-2 and a substrate 110. Moreover, a spacer 130 may, in some embodiments, be between the first and second transistors T-1, T-2. For example, the spacer 130 may be an insulating spacer.

The fin(s) F and the nanosheet stack 120 may each comprise a semiconductor material. For example, a plurality of nanosheets NS (FIG. 2M) that are vertically stacked in the nanosheet stack 120 may each comprise the same semiconductor material as the fin(s) F. As an example, the nanosheets NS and the fin(s) F may each comprise silicon ("Si"). In some embodiments, the substrate 110 may include the same material (e.g., Si) as the nanosheets NS and the fin(s) F. In other embodiments, at least one of the substrate 110, the nanosheets NS, and the fin(s) F may include a material that is different from that of the other(s) of the substrate 110, the nanosheets NS, and the fin(s) F.

The fin(s) F may comprise, for example, one, two, three, or more fins F on the nanosheet stack 120. In embodiments having two or more fins F on the nanosheet stack 120, the fins F may be spaced apart from each other in a horizontal direction X, which may be perpendicular to the vertical direction Z and perpendicular to another horizontal direction Y. In embodiments having only one fin F on the nanosheet stack 120, the sole fin F may have an outer sidewall that is aligned with a sidewall of the nanosheet stack 120.

For simplicity of illustration, gates of the transistor stack 100 are omitted from view. It will be understood, however, that the stack 100 includes one or more gates (e.g., one or more metal gates). As an example, each transistor T in the stack 100 may, in some embodiments, have a respective gate. In other embodiments, the spacer 130 may be omitted and/or the two transistors T in the stack 100 may share a common gate.

For further simplicity of illustration, only one stack 100 is shown in FIG. 1. It will be understood, however, that operations described herein with respect to FIGS. 2A-2P and 3 may be used to simultaneously form the stack 100 along with other stacks 100.

Figure 2A:
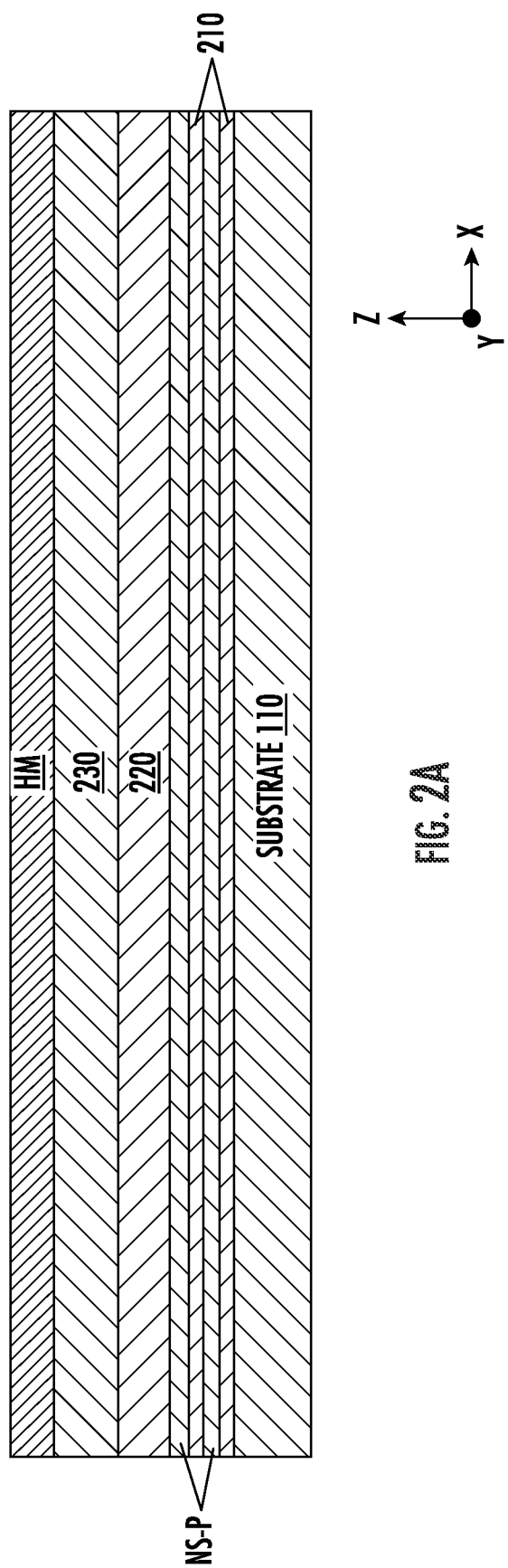
FIGS. 2A-2P are cross-sectional views illustrating operations of forming a plurality of transistor stacks according to some embodiments of the present invention.
Figure 3:
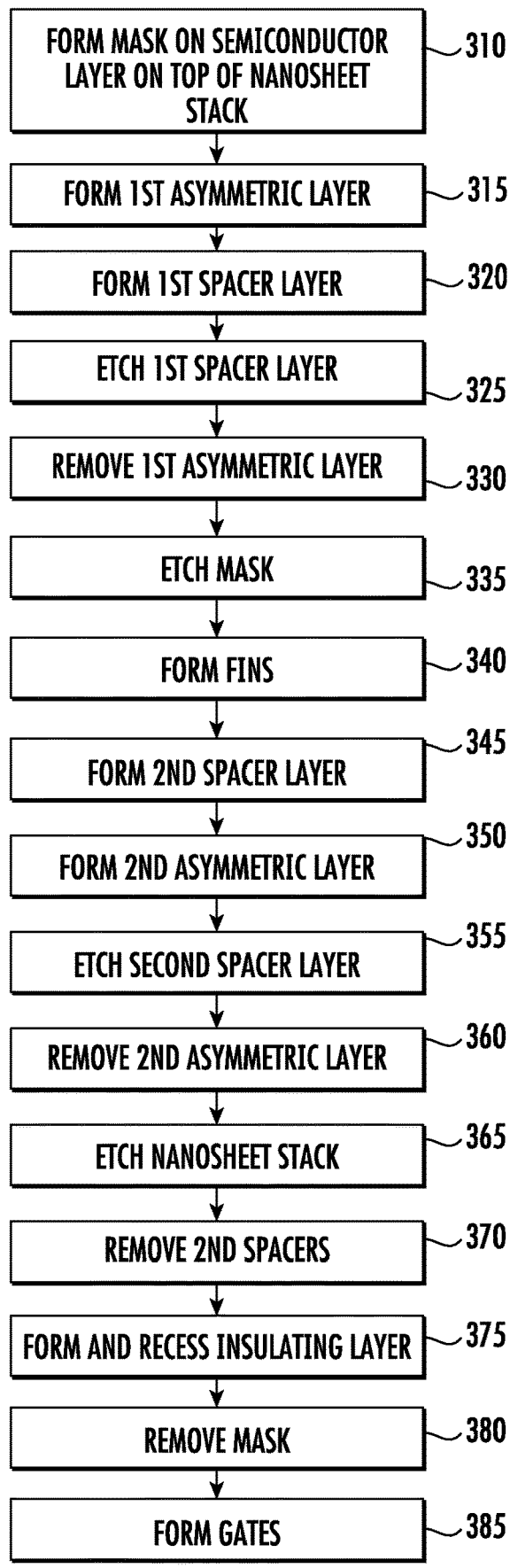
FIG. 3 is a flowchart corresponding to the operations shown in FIGS. 2A-2P.

FIGS. 2A-2P are cross-sectional views illustrating operations of forming a plurality of transistor stacks 100 according to some embodiments of the present invention. FIG. 3 is a flowchart corresponding to the operations shown in FIGS. 2A-2P.

As shown in FIGS. 2A and 3, a mask HM is formed (Block 310) on a vertical stack that includes a plurality of preliminary nanosheets NS-P and a semiconductor layer 230 that is on top of the preliminary nanosheets NS-P. The semiconductor layer 230 is between, in the vertical direction Z, the mask HM and the preliminary nanosheets NS-P. The mask HM may be a hardmask layer, which may comprise, for example, Si nitride ("SiN") or Si carbide ("SiC").

The vertical stack that includes the preliminary nanosheets NS-P and the semiconductor layer 230 may be referred to herein as a "preliminary transistor stack," as this stack will be etched to form a plurality of transistor stacks 100 (FIG. 2P), each of which includes a first (lower) transistor T-1 (FIG. 1) and a second (upper) transistor T-2 (FIG. 1). The preliminary nanosheets NS-P will be etched to form nanosheets NS (FIG. 2M) of the first transistors T-1, and the semiconductor layer 230 will be etched to form fin(s) F (FIG. 2G) of the second transistors T-2 (FIG. 1).

Moreover, the preliminary transistor stack may, in some embodiments, also include a plurality of sacrificial layers 210 that may alternate with the preliminary nanosheets NS-P in the vertical stack. The sacrificial layers 210 may comprise, for example, silicon germanium ("SiGe"), and the preliminary nanosheets NS-P may each be, for example, an Si sheet. In some embodiments, the sacrificial layers 210 and/or the preliminary nanosheets NS-P may be epitaxially grown on a substrate 110, which may comprise Si. The preliminary nanosheets NS-P may be referred to herein as "channel layers," as the preliminary nanosheets NS-P will be etched to form nanosheets NS that function as respective channel regions of a transistor T-1.

The preliminary transistor stack may further include a spacer 220 that is between, in the vertical direction Z, the semiconductor layer 230 and the preliminary nanosheets NS-P. In some embodiments, the spacer 220 may be a sacrificial layer. As an example, the spacer 220 may comprise the same material (e.g., SiGe) as the sacrificial layers 210. The spacer 220 is thicker, in the vertical direction Z, than the sacrificial layers 210 (e.g., individually and collectively).

Figure 2B:
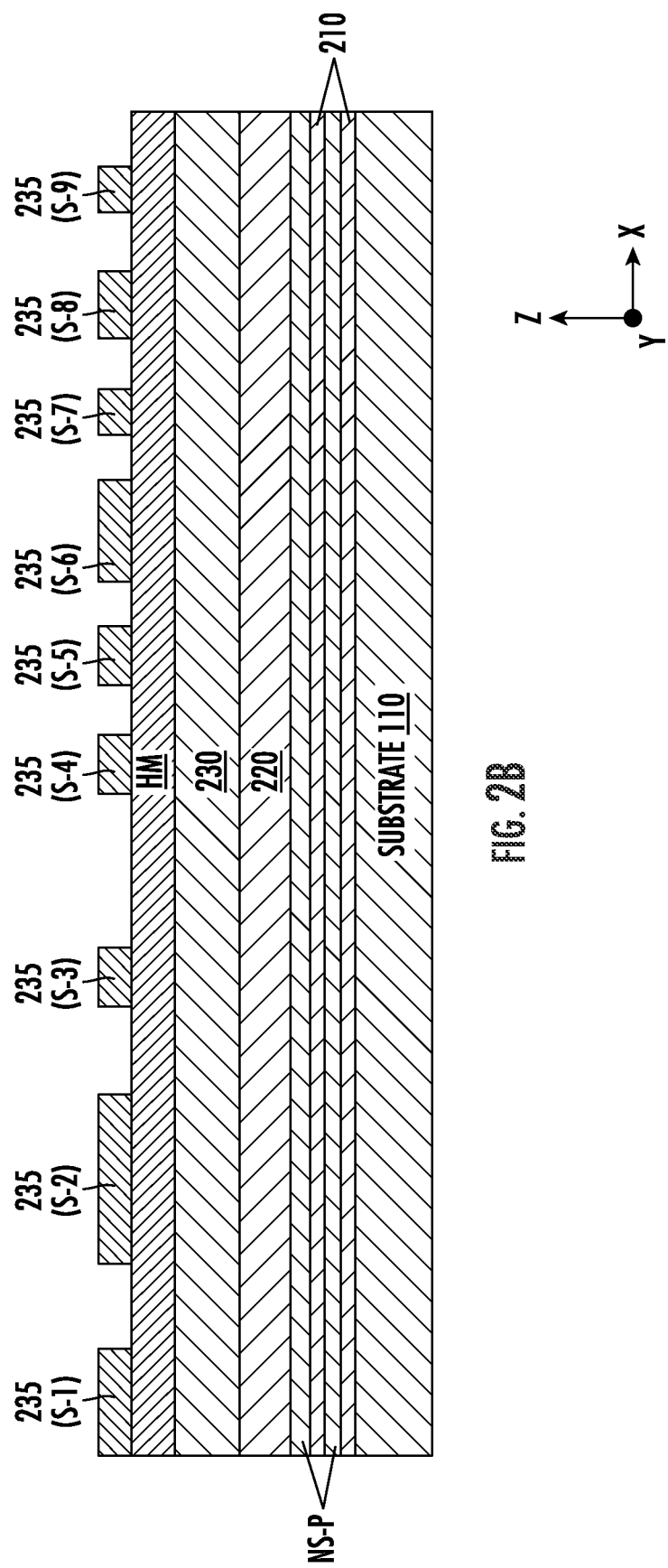

Referring to FIGS. 2B and 3, a first asymmetric layer 235 may be formed (Block 315) on an upper surface of the mask HM. The first asymmetric layer 235 comprises a plurality of segments S that are spaced apart from each other in the horizontal direction X. As a result, the first asymmetric layer 235 covers some portions of the upper surface of the mask HM and exposes other portions of the upper surface of the mask HM.

FIG. 2B shows an example in which the first asymmetric layer 235 includes nine segments S-1 through S-9. At least some of the segments S have different respective widths in the horizontal direction X. As an example, the first segment S-1 is wider than the ninth segment S-9 and narrower than the second segment S-2. Others of the segments S may, in some embodiments, have equal widths in the horizontal direction X. For example, a width of the fifth segment S-5 may be equal to a width of the eighth segment S-8.

Moreover, widths of the gaps between adjacent ones of the segments S may be different. For example, FIG. 2B shows that a gap between the third segment S-3 and the fourth segment S-4 is wider, in the horizontal direction X, than a gap between the first segment S-1 and the second segment S-2. Other gaps may be the same. As an example, the gap between the first segment S-1 and the second segment S-2 may be equal in width, in the horizontal direction X, to a gap between the second segment S-2 and the third segment S-3.

The number of segments S, the widths of the segments S, and/or the widths of gaps between adjacent ones of the segments S may vary based on (i) the number of fins F, (ii) the locations of the fins F, (iii) the number of transistor stacks 100, and/or (iv) the widths of the stacks 100 that are to be formed from the preliminary transistor stack. Moreover, the first asymmetric layer 235 may, in some embodiments, be an organic planarization layer ("OPL"). As an example, the OPL may comprise one or more non-Si semiconductor materials.

Figure 2C:
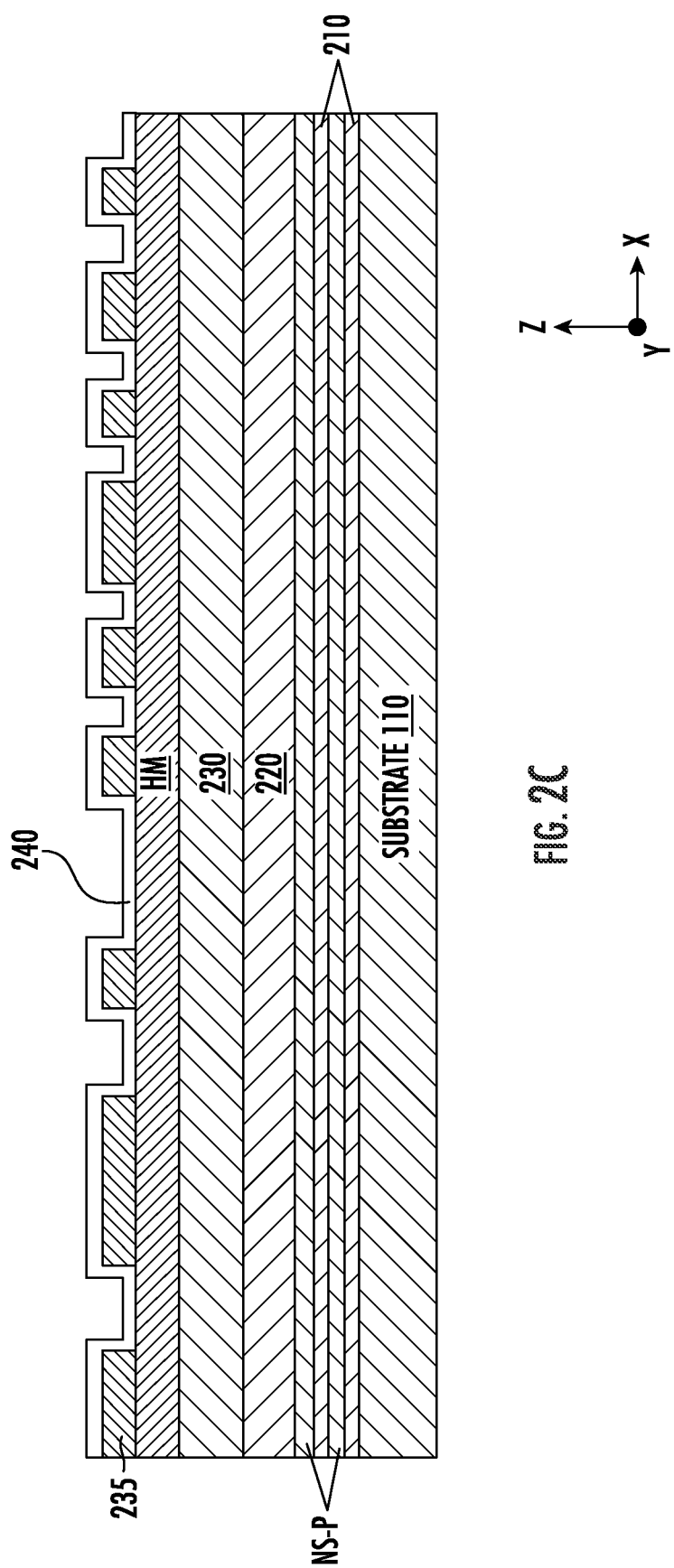

Referring to FIGS. 2C and 3, a first spacer layer 240 is formed (Block 320), such as deposited, on top of the first asymmetric layer 235 and the mask HM. The first spacer layer 240 may comprise, for example, SiN or an oxide material (e.g., Si oxide ("SiO$_x$") or Si oxynitride ("SiON")). In some embodiments, the first spacer layer 240 may be implemented as a thin film that is conformally deposited (e.g., using atomic layer deposition ("ALD")) on the first asymmetric layer 235.

Figure 2D:
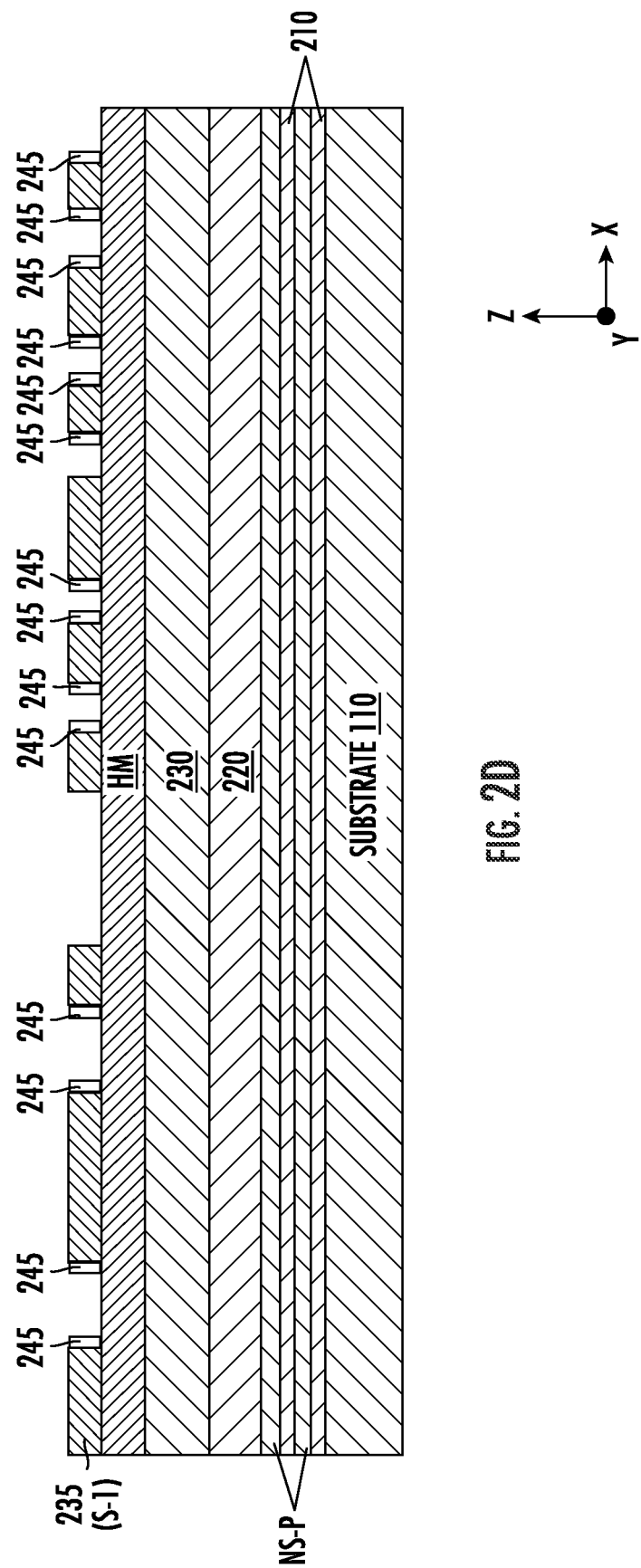

Referring to FIGS. 2D and 3, the first spacer layer 240 may be etched back (Block 325) to provide first spacers 245 on sidewalls of (at least some of) the segments S of the asymmetric layer 235. The first spacers 245 are portions (e.g., mandrels) of the first spacer layer 240 that remain after the etch-back. In some embodiments, the first spacer layer 240 may be selectively removed from one or more (but not all) sidewalls of the segments S, depending on the number and locations of first spacers 245 that are to be formed from the first spacer layer 240. For example, a mask layer (i.e., a layer having etch selectivity with respect to the first spacer layer 240) may be formed on top of the portions of the first spacer layer 240 that are to remain on the sidewalls of the segments S, and may expose other portions of the first spacer layer 240. The exposed other portions of the first spacer layer 240 can then be etched to remove them from sidewalls of the segments S. As another example, the mask layer may be formed after the etch-back that forms the first spacers 245, and may expose ones of the first spacers 245 that are to be removed from sidewalls of the segments S. As a result of selectively removing portions of the first spacer layer 240 (or ones of the first spacers 245), particular ones (but not all) of the sidewalls of the segments S may be free of any first spacer 245 thereon.

Figure 2E:
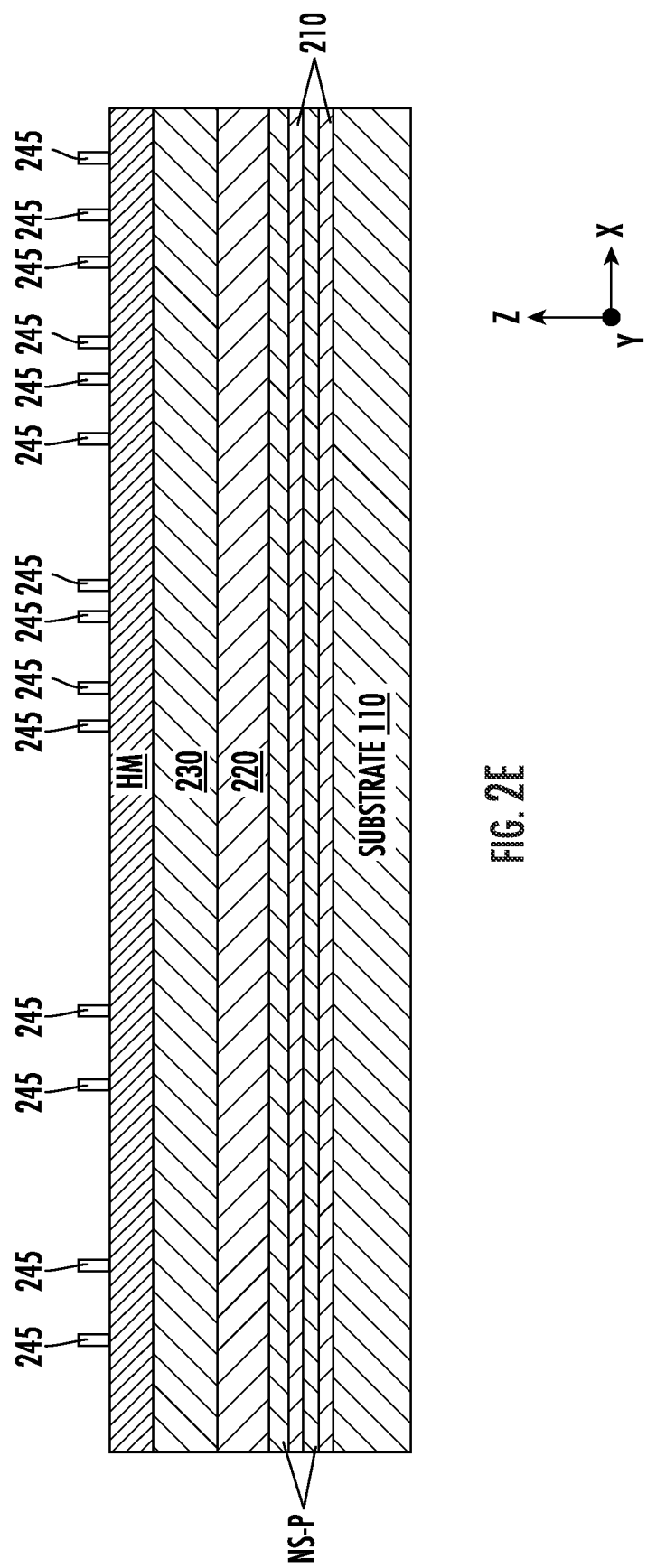

Referring to FIGS. 2E and 3, the first asymmetric layer 235 may be removed (Block 330) after forming the first spacers 245. Accordingly, the first asymmetric layer 235 may have etch selectivity with respect to the first spacers 245 and the mask HM (which may be a hard mask).

Figure 2F:
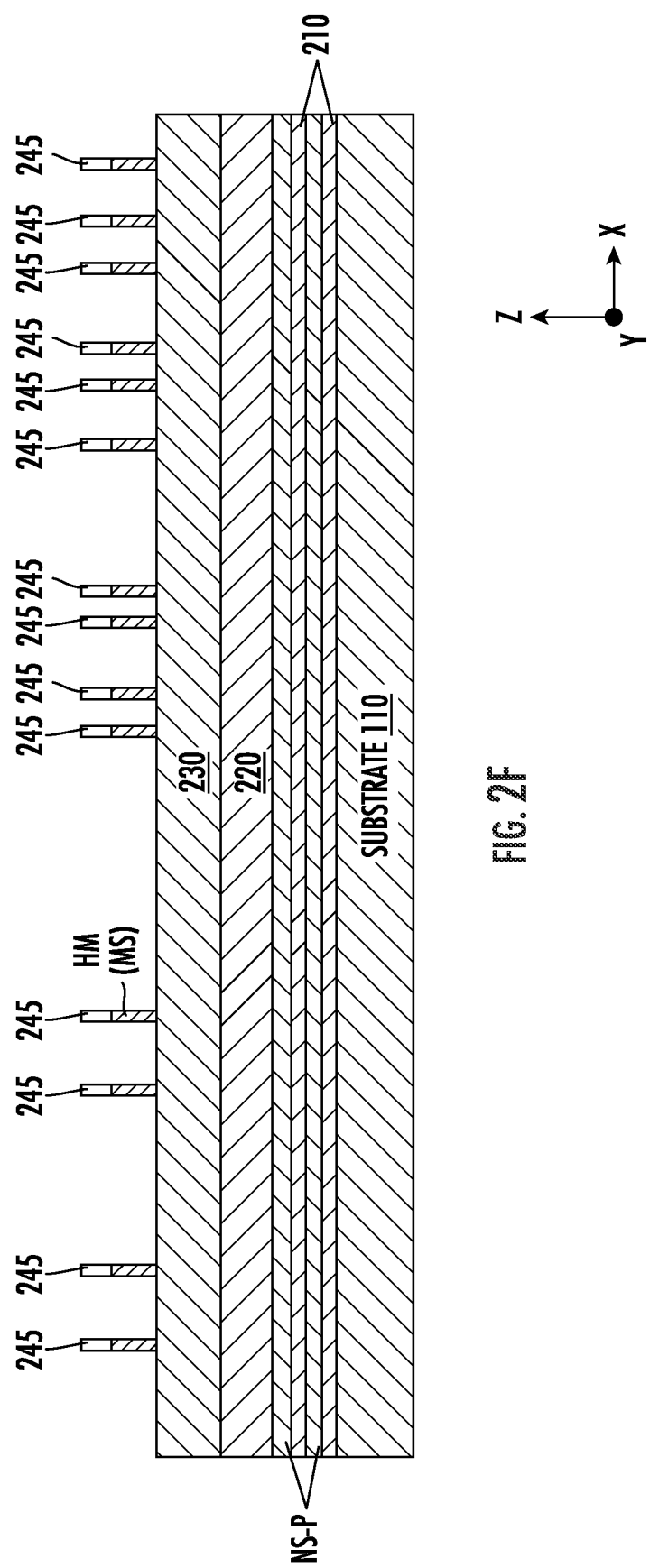

Referring to FIGS. 2F and 3, the hard mask HM is etched (Block 335), while the first spacers 245 are thereon, to form a plurality of mask segments MS on the semiconductor layer 230. The mask segments MS are portions of the mask HM that are spaced apart from each other in the horizontal direction X. The mask segments MS may have approximately the same X-axis locations and spacings as the respective spacers 245 thereon. Each mask segment MS is between, in the vertical direction Z, a respective one of the first spacers 245 and the semiconductor layer 230. By using the first spacers 245 as an etch mask, some portions of the upper surface of the semiconductor layer 230 remain covered (by the mask segments MS) after etching the mask HM and other portions of the upper surface of the semiconductor layer 230 are exposed. The first spacers 245 may be removed after forming the mask segments MS.

Figure 2G:
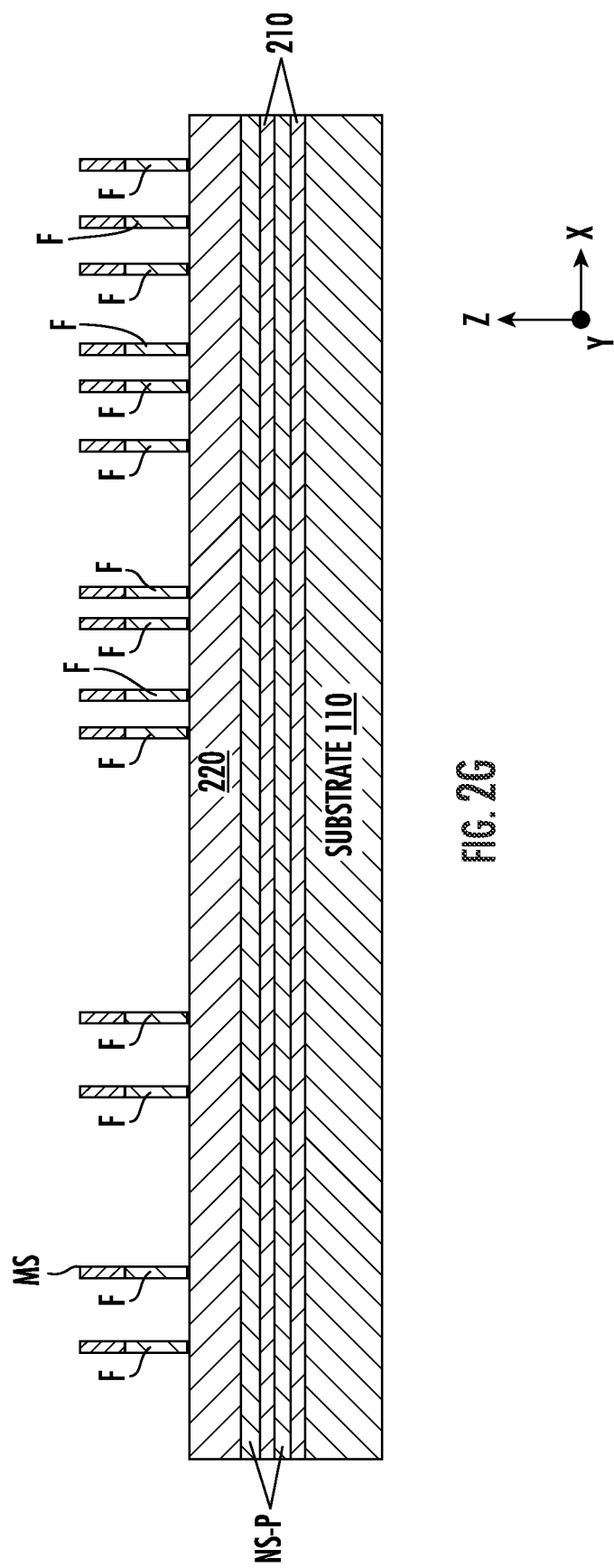

Referring to FIGS. 2G and 3, the semiconductor layer 230 is etched (Block 340), using the mask segments MS as an etch mask, to form a plurality of fins F. The fins F are portions of the semiconductor layer 230 that are spaced apart from each other in the horizontal direction X. The fins F may have approximately the same X-axis locations and spacings as the respective mask segments MS thereon. Each fin F is between, in the vertical direction Z, a respective one of the mask segments MS and a stack of the preliminary nanosheets NS-P. As an example, an upper surface of each fin F may contact the lower surface of the respective one of the mask segments MS and a lower surface of each fin F may contact the spacer 220 that separates the fins F from the preliminary nanosheets NS-P.

Figure 2H:
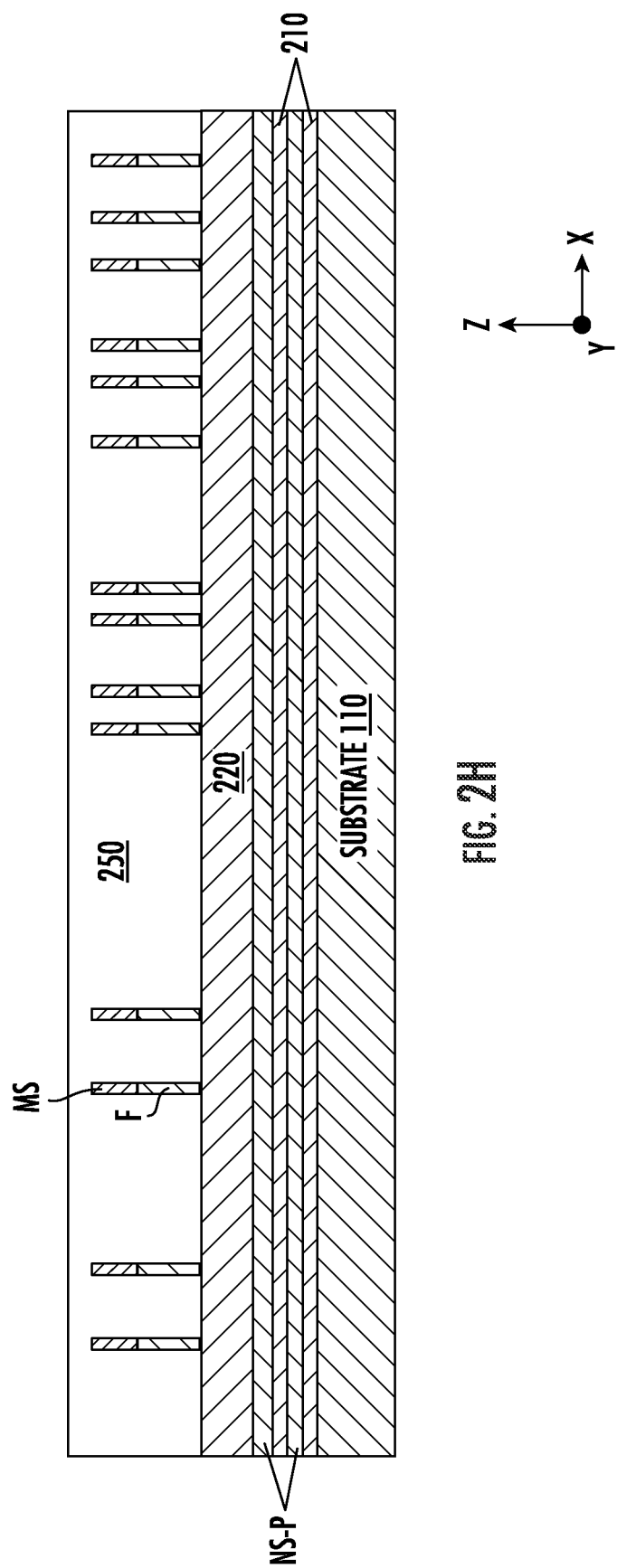
Figure 2:
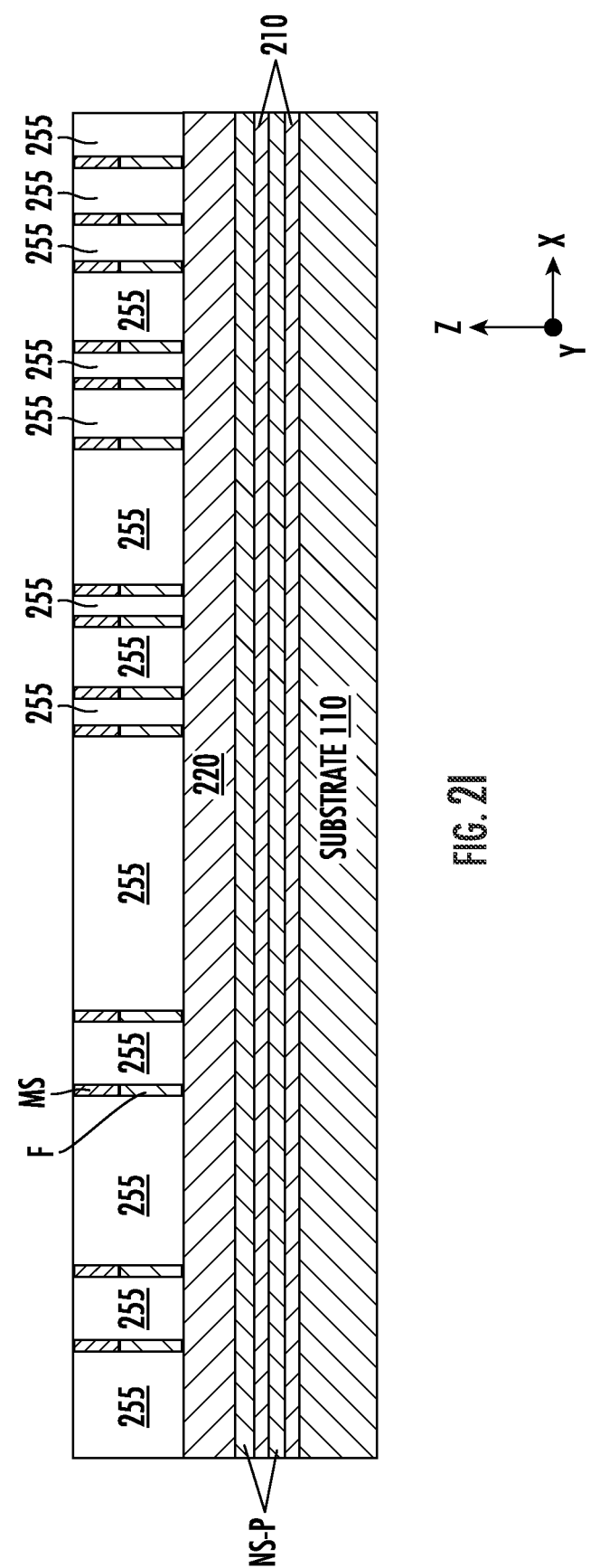

Referring to FIGS. 2H and 3, a second spacer layer 250 is formed (Block 345), such as deposited, on the mask segments MS and the fins F. The second spacer layer 250 may comprise, for example, SiN or an oxide material (e.g., $SiO_x$ or SiON).

Referring to FIG. 2I, the second spacer layer 250 is etched back to provide an etched-back second spacer layer 255 that is between the fins F and between the mask segments MS. For example, the etched-back second spacer layer 255 may have an upper surface that is coplanar with respective upper surfaces of the mask segments MS.

Figure 2J:
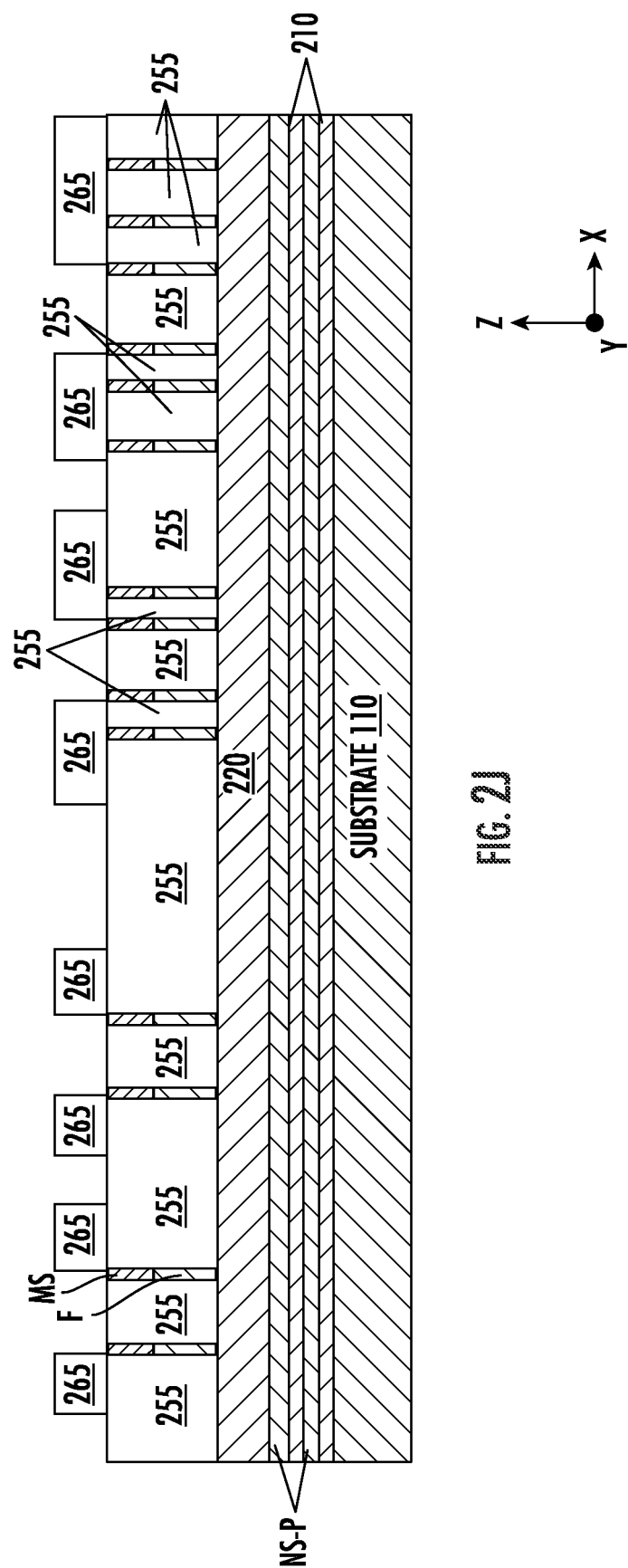

Referring the FIGS. 2J and 3, a second asymmetric layer 265 is formed (Block 350) on an upper surface of the etched-back second spacer layer 255. The second asymmetric layer 265 includes a plurality of portions that are spaced apart from each other in the horizontal direction X. As with the segments S of the first asymmetric layer 235 (FIG. 2B), at least some of the spaced-apart portions of the second asymmetric layer 265 may have different respective widths (and/or different gaps therebetween) in the horizontal direction X. The spaced-apart portions of the second asymmetric layer 265 cover portions of the upper surface of the etched-back second spacer layer 255, while exposing other portions of the upper surface of the etched-back second spacer layer 255. The second asymmetric layer 265 can thus serve as a mask for selectively removing portions of the etched-back second spacer layer 255.

Referring to FIGS. 2K and 3, second spacers 255' are formed (Block 355) on sidewalls of the fins F (and on sidewalls of the mask segments MS) by etching the exposed portions of the etched-back second spacer layer 255 while using the second asymmetric layer 265 as an etch mask. The second spacers 255' are thus portions of the etched-back second spacer layer 255 that were covered by the second asymmetric layer 265 during the etching. As shown in FIGS. 2F-2K, the first spacers 245 may be removed before forming the second spacers 255'.

Figure 2L:
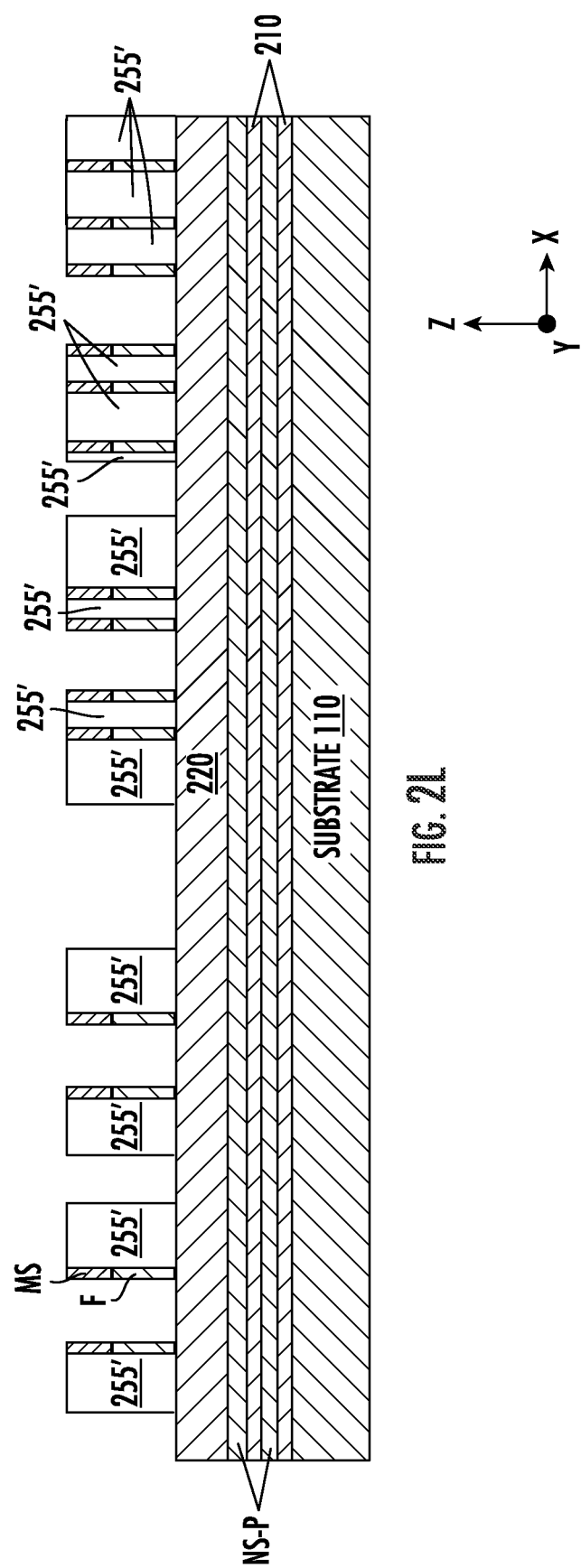

Referring to FIGS. 2L and 3, the second asymmetric layer 265 is removed (Block 360) from respective upper surfaces of the second spacers 255'. The second spacers 255' remain in selective locations where they can subsequently be used as a mask for etching the preliminary nanosheets NS-P.

Figure 2M:
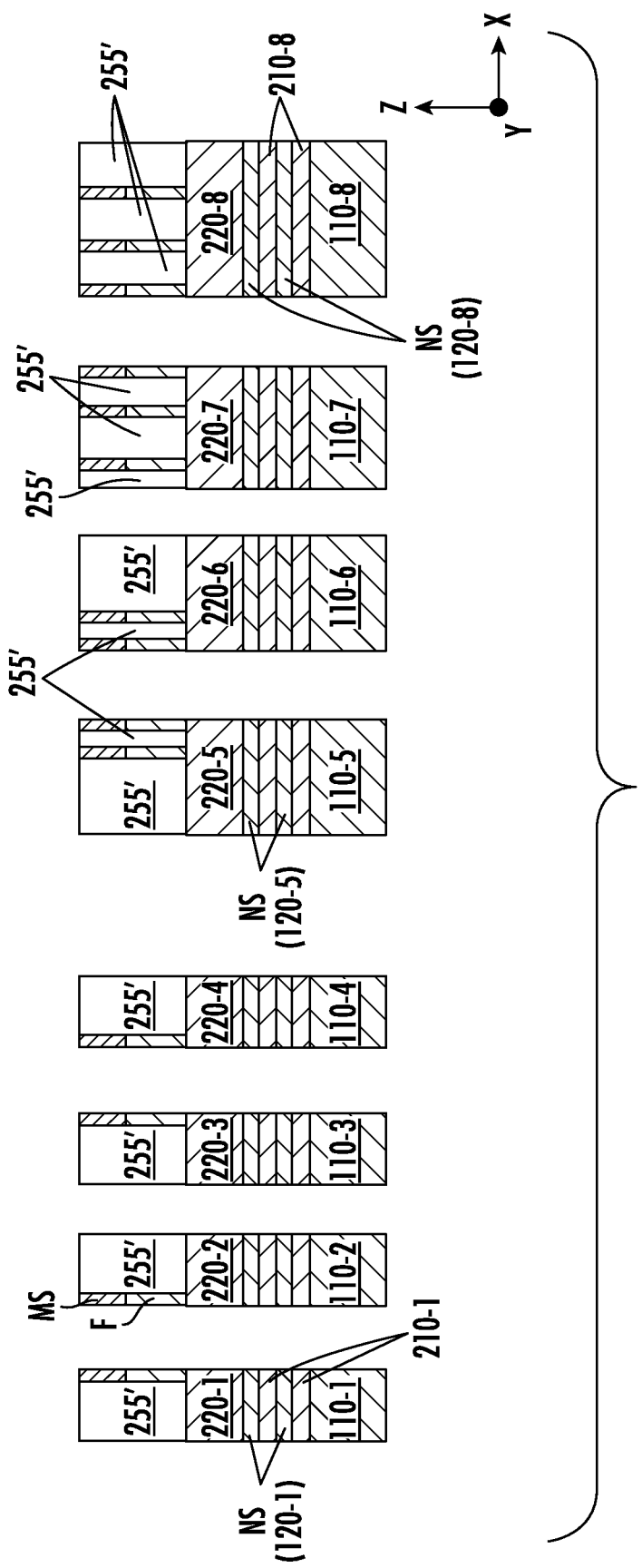
Figure 20:
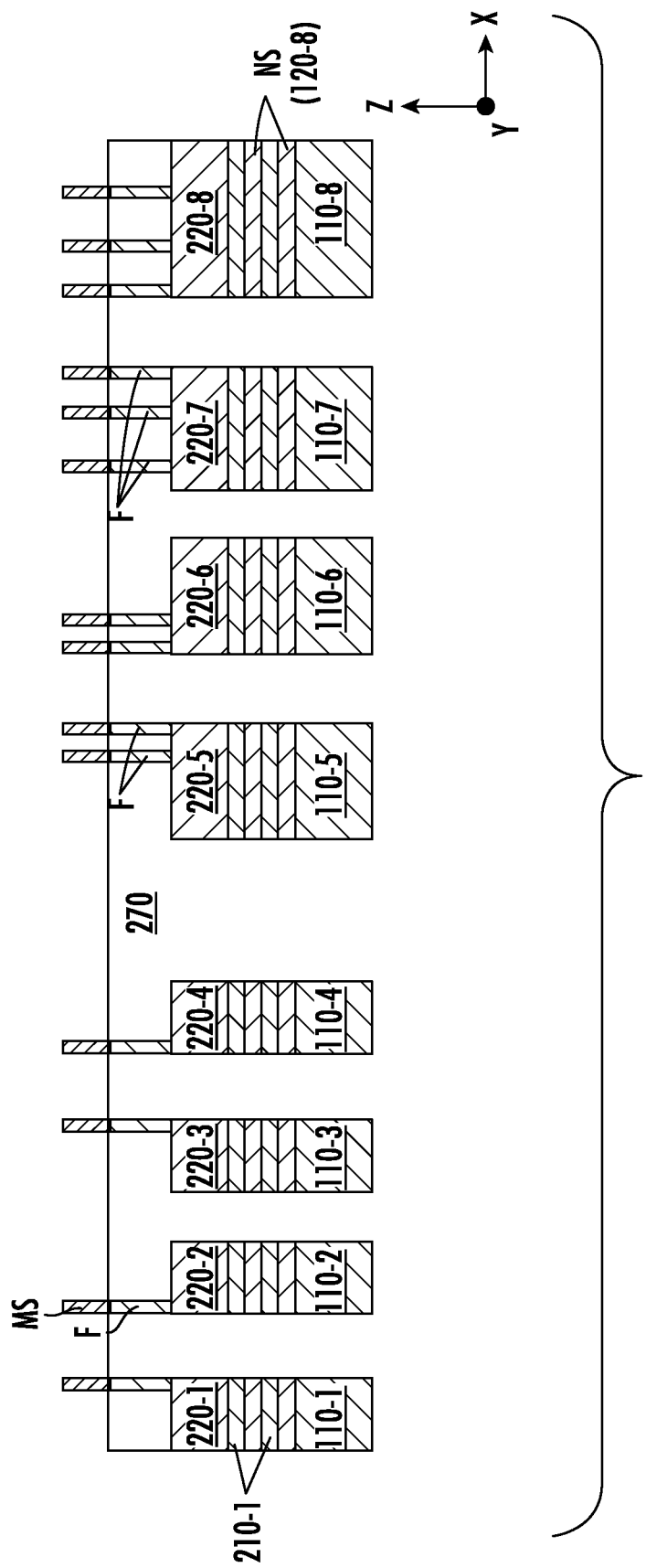

Referring to FIGS. 2M and 3, the preliminary nanosheets NS-P are selectively etched (Block 365) while the second spacers 255' are on sidewalls of the fins F. As a result, the preliminary nanosheets NS-P of the preliminary transistor stack are separated into different nanosheet stacks 120 that are spaced apart from each other in the horizontal direction X. As an example, FIG. 2M shows eight nanosheet stacks 120-1 through 120-8. The sacrificial layers 210 may also be separated into a plurality of stacks of sacrificial layers 210-1 through 210-8. The substrate 110 may, likewise, be separated into a plurality of substrates 110-1 through 110-8 that are spaced apart from each other in the horizontal direction X, and the spacer 220 may be separated into a plurality of spacers 220-1 through 220-8 that are on the nanosheet stacks 120-1 through 120-8, respectively. The nanosheet stacks 120-1 through 120-8 are on the substrates 110-1 through 110-8, respectively. More or fewer nanosheet stacks 120 may be provided by varying the number, locations, and/or widths of the second spacers 255'.

Each nanosheet stack 120 has at least one fin F thereon. As shown in FIG. 2M, the first nanosheet stack 120-1 has a single fin F thereon, whereas the fifth and eighth nanosheet stacks 120-5, 120-8 have two and three fins F, respectively, thereon.

Referring to FIGS. 2N and 3, the second spacers 255' are removed (Block 370) from sidewalls of the fins F and sidewalls of the mask segments MS. As a result, portions of upper surfaces of the spacers 220 may be exposed.

Referring to FIGS. 2O and 3, a dielectric (i.e., insulating) layer 270 is formed (Block 375) on the fins F. As an example, the dielectric layer 270 may be formed by performing an interlayer dielectric layer gap-fill operation. The dielectric layer 270 may be recessed to have an upper surface that is coplanar with respective upper surfaces of the fins F, thereby exposing upper surfaces and sidewalls of the mask segments. The dielectric layer 270 may comprise, for example, an oxide material.

Referring to FIGS. 2P and 3, the mask segments MS are removed (Block 380) from the upper surfaces of the fins F. As a result, a plurality of transistor stacks 100-1 through 100-8 are formed. Each of the transistor stacks 100 includes a respective substrate 110 (or a respective portion of a single substrate 110), a respective nanosheet stack 120 having a plurality of nanosheets NS, sacrificial layers 210 that alternate with the nanosheets NS, a respective spacer 220, and at least one fin F.

The first through fourth transistor stacks 100-1 through 100-4 each include a single fin F that is aligned with a sidewall of a respective underlying nanosheet stack 120. In some embodiments, the nanosheet stacks 120-1 through 120-4 each have the same width in the horizontal direction X. Moreover, the fin F of the second transistor stack 100-2 may be closer to the fin F of the first transistor stack 100-1 than to the fin F of the third transistor stack 100-3.

The fifth and sixth transistor stacks 100-5, 100-6 each include two fins F. One of the two fins F is aligned with a sidewall of the underlying nanosheet stack 120. The other of the two fins may be closer to the sidewall-aligned one of the two fins F than it is to the opposite sidewall of the underlying nanosheet stack 120. In some embodiments, the nanosheet stacks 120-5, 120-6 each have the same width in the horizontal direction X, and this width may be twice the width of each of the nanosheet stacks 120-1 through 120-4.

The seventh and eighth transistor stacks 100-7, 100-8 each include three fins F. One of the three fins F is aligned with a sidewall of the underlying nanosheet stack 120. The other two of the three fins may be spaced apart from the opposite sidewall of the underlying nanosheet stack 120. In some embodiments, the nanosheet stacks 120-7, 120-8 may have different widths in the horizontal direction X. For example, the seventh nanosheet stack 120-7 may have the same width as each of the fifth and sixth nanosheet stacks 120-5, 120-6. Moreover, the eighth nanosheet stack 120-8 may be wider (e.g., 50% wider) than the seventh nanosheet stack 120-7.

In some embodiments, devices herein may have a "stepped" fin-on-nanosheet structure, which may be provided by having a fin F share a side with (e.g., be aligned with a sidewall of) an underlying nanosheet stack 120. The stepped structure may facilitate formation of separate contacts on the fin F and the nanosheet stack 120, respectively. Moreover, the second asymmetric layer 265 (FIG. 2K) may define boundaries between different nanosheet stacks 120. According to other embodiments, the second asymmetric layer 265 may be centered on a fin F, thereby facilitating formation of a structure that is stepped with respect to both right and left sides of a nanosheet stack 120 and/or symmetrical with respect to the fin F.

Referring to FIG. 3, gates may be formed (Block 385) in the transistor stacks 100. For example, the dielectric layer 270 may be recessed to expose sidewalls of the sacrificial layers 210 after removing the mask segments MS, and the sacrificial layers 210 may then be replaced with a gate metal. In some embodiments, a respective gate of each transistor stack 100 is a common (i.e., connected/continuous) gate that is on the fin(s) F as well as the nanosheets NS. In other embodiments, each transistor stack 100 may have separate gates, respectively, for its two transistors T (FIG. 1). Accordingly, an upper gate may be on the fin(s) F of a transistor stack 100, and a lower gate may be on the nanosheets NS of the transistor stack 100 and may be separate from the upper gate.

Moreover, the respective spacer 220 of each transistor stack 100 may be a sacrificial spacer that is replaced with an insulating spacer 130 (FIG. 1). For example, the insulating spacer 130 may comprise SiN or $SiO_x$. In some embodiments, the insulating spacer 130 may be formed before replacing the sacrificial layers 210 with a gate metal. In other embodiments, the insulating spacer 130 may be formed after replacing the sacrificial layers 210 with the gate metal.

Methods of forming transistor stacks 100 (FIG. 2P) according to embodiments of the present invention may provide a number of advantages. These advantages include forming transistor stacks 100 (FIG. 1) that can include multiple fins F (FIG. 2P), as well as forming asymmetrically-arranged fins F. One example of forming asymmetric fins F is forming a fin F having a sidewall that is aligned with a sidewall of an underlying nanosheet stack 120 (FIG. 2M) and one or more other fins F that are on the nanosheet stack 120 but do not have a sidewall aligned with an opposite sidewall of the nanosheet stack 120. Another example is forming fins F on opposite ends (right vs. left) of adjacent nanosheet stacks 120. Accordingly, fins F may be asymmetrically arranged along the horizontal direction X within a particular transistor stack 100 and/or with respect to an adjacent transistor stack 100. Moreover, the methods of the present invention may be relatively easy to implement because of similarities with conventional FinFET processes.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present invention are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the present invention should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A method of forming a plurality of transistor stacks, the method comprising:
   providing a stack comprising a plurality of nanosheets and a semiconductor layer that is on the nanosheets;
   forming a mask on the stack, wherein the semiconductor layer is between the mask and the nanosheets;
   forming an asymmetric layer on the mask, the asymmetric layer comprising a plurality of segments, at least some of which have different respective widths;
   forming first spacers on sidewalls of the segments of the asymmetric layer;
   etching the mask, while the first spacers are thereon, to form a plurality of mask segments between the first spacers, respectively, and the semiconductor layer;
   etching the semiconductor layer to form a plurality of fins between the mask segments, respectively, and the nanosheets;
   forming second spacers on sidewalls of the fins; and
   etching the nanosheets, while the second spacers are on the sidewalls of the fins, to provide a plurality of spaced-apart nanosheet stacks that each have at least one of the fins thereon with a corresponding fin sidewall that is coplanar with a sidewall of an underlying one of the plurality of spaced-apart nanosheet stacks.

2. The method of claim 1, wherein the nanosheet stacks comprise:
   a first nanosheet stack having a first of the fins thereon;
   a second nanosheet stack having a second and a third of the fins thereon; and
   a third nanosheet stack having a fourth, a fifth, and a sixth of the fins thereon.

3. The method of claim 2, wherein the first nanosheet stack is narrower than the second nanosheet stack.

4. The method of claim 3, wherein the second nanosheet stack is narrower than the third nanosheet stack.

5. The method of claim 4, wherein the nanosheet stacks further comprise a fourth nanosheet stack having a seventh, an eighth, and a ninth of the fins thereon.

6. The method of claim 5, wherein the fourth nanosheet stack is narrower than the third nanosheet stack.

7. The method of claim 6, wherein the fourth nanosheet stack has a width equal to that of the second nanosheet stack.

8. The method of claim 2,
   wherein a sidewall of the first of the fins is aligned with a sidewall of the first nanosheet stack,
   wherein a sidewall of the second of the fins is aligned with a sidewall of the second nanosheet stack, and
   wherein a sidewall of the fourth of the fins is aligned with a sidewall of the third nanosheet stack.

9. The method of claim 1, wherein the asymmetric layer comprises an organic planarization layer.

10. The method of claim 1, wherein the stack further comprises a spacer layer that is between the nanosheets and the semiconductor layer.

11. The method of claim 1, further comprising removing the first spacers before forming the second spacers.

12. A method of forming a plurality of transistor stacks, the method comprising:
   providing a stack comprising a plurality of nanosheets and a semiconductor layer that is on the nanosheets;
   forming a mask on the stack, wherein the semiconductor layer is between the mask and the nanosheets;
   forming an asymmetric layer on the mask, the asymmetric layer comprising a plurality of segments, at least some of which have different respective widths;
   forming first spacers on sidewalls of the segments of the asymmetric layer;
   etching the mask, while the first spacers are thereon, to form a plurality of mask segments between the first spacers, respectively, and the semiconductor layer;
   etching the semiconductor layer to form a plurality of fins between the mask segments, respectively, and the nanosheets;
   forming second spacers on sidewalls of the fins; and
   etching the nanosheets, while the second spacers are on the sidewalls of the fins, to provide a plurality of spaced-apart nanosheet stacks that each have at least one of the fins thereon;
   wherein the asymmetric layer comprises a first asymmetric layer, and
   wherein the forming the second spacers comprises:
      forming a spacer layer between the sidewalls of the fins;
      forming a second asymmetric layer on first portions of the spacer layer; and etching second portions of the spacer layer, while the second asymmetric layer is on the first portions, to form the second spacers.

13. The method of claim 12, wherein the first and second asymmetric layers comprise respective organic planarization layers.

14. A method of forming a plurality of transistor stacks, the method comprising etching a plurality of nanosheets, using a plurality of spacers that are on sidewalls of a plurality of semiconductor fins as an etch mask, to provide a plurality of spaced-apart nanosheet stacks that each have at least one of the semiconductor fins thereon with a corresponding fin sidewall that is coplanar and in vertical alignment with a sidewall of an underlying one of the plurality of spaced-apart nanosheet stacks.

15. The method of claim 14, further comprising:
before etching the nanosheets, forming the semiconductor fins by etching a semiconductor layer.

16. The method of claim 15, further comprising:
before forming the semiconductor fins, forming a mask on the semiconductor layer;
forming an asymmetric layer on the mask, the asymmetric layer comprising a plurality of segments, at least some of which have different respective widths;
forming first spacers on sidewalls of the segments of the asymmetric layer; and
etching the mask, while the first spacers are thereon, to form a plurality of mask segments between the first spacers, respectively, and the semiconductor layer,
wherein the semiconductor fins are formed between the mask segments, respectively, and the nanosheets, and
wherein the spacers that are on the sidewalls of the semiconductor fins comprise second spacers.

17. A method of forming a plurality of transistor stacks, the method comprising:
forming an asymmetric layer comprising a plurality of segments, at least some of which have different respective widths, on a mask that is on a plurality of nanosheets;
forming a plurality of spacers on sidewalls of the segments of the asymmetric layer;
etching the mask, while the spacers are thereon, to form a plurality of mask segments; and
etching a semiconductor layer that is between the mask segments and the nanosheets to form a plurality of fins between the mask segments, respectively, and the nanosheets;
wherein the spacers comprise first spacers, and
wherein the method further comprises:
forming second spacers on sidewalls of the fins; and
etching the nanosheets, using the second spacers as an etch mask, to provide a plurality of spaced-apart nanosheet stacks that each have at least one of the fins thereon with a corresponding fin sidewall that is coplanar and in vertical alignment with a sidewall of an underlying one of the plurality of spaced-apart nanosheet stacks.

18. The method of claim 17, wherein the asymmetric layer comprises an organic planarization layer.

19. The method of claim 17, further comprising removing the first spacers before forming the second spacers.

* * * * *